United States Patent
Cho

(10) Patent No.: US 7,646,663 B2
(45) Date of Patent: Jan. 12, 2010

(54) SEMICONDUCTOR MEMORY DEVICE AND WORD LINE ADDRESSING METHOD IN WHICH NEIGHBORING WORD LINES ARE DISCONTINUOUSLY ADDRESSED

(75) Inventor: Ji Ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 66 days.

(21) Appl. No.: 11/593,496

(22) Filed: Nov. 7, 2006

(65) Prior Publication Data

US 2007/0153621 A1 Jul. 5, 2007

(30) Foreign Application Priority Data

Jan. 2, 2006 (KR) .................. 10-2006-0000052

(51) Int. Cl.
*G11C 8/00* (2006.01)
(52) U.S. Cl. .................. 365/230.06; 365/230.02; 365/230.04; 365/230.09
(58) Field of Classification Search ............ 365/230.06, 365/230.02, 230.04, 230.09
See application file for complete search history.

(56) References Cited

U.S. PATENT DOCUMENTS

| | | | | |
|---|---|---|---|---|
| 5,208,782 A | * | 5/1993 | Sakuta et al. | 365/230.03 |
| 5,233,559 A | * | 8/1993 | Brennan, Jr. | 365/185.09 |
| 5,406,526 A | * | 4/1995 | Sugibayashi et al. | 365/230.03 |
| 5,444,667 A | * | 8/1995 | Obara | 365/233.1 |
| 5,615,164 A | * | 3/1997 | Kirihata et al. | 365/230.06 |
| 5,619,460 A | * | 4/1997 | Kirihata et al. | 365/201 |
| 5,719,819 A | * | 2/1998 | Maeno | 365/230.06 |
| RE35,934 E | * | 10/1998 | Takai | 365/189.05 |
| 5,933,725 A | * | 8/1999 | Kirsch et al. | 438/239 |
| 5,943,289 A | * | 8/1999 | Ahn et al. | 365/230.06 |
| 6,002,636 A | * | 12/1999 | Tsuchida et al. | 365/230.06 |
| 6,034,879 A | * | 3/2000 | Min et al. | 365/63 |
| 6,115,306 A | * | 9/2000 | Shore et al. | 365/201 |
| 6,163,475 A | * | 12/2000 | Proebsting | 365/63 |
| 6,215,723 B1 | * | 4/2001 | Kang et al. | 365/230.06 |
| 6,233,198 B1 | * | 5/2001 | Choi | 365/230.06 |
| 6,292,387 B1 | * | 9/2001 | McClain | 365/149 |
| 6,292,421 B1 | * | 9/2001 | Shore et al. | 365/222 |
| 6,449,195 B1 | * | 9/2002 | Min et al. | 365/189.05 |
| 6,490,222 B2 | * | 12/2002 | Choi et al. | 365/201 |
| 6,501,672 B1 | * | 12/2002 | Sekiguchi et al. | 365/72 |
| 6,535,451 B2 | * | 3/2003 | Sekiguchi et al. | 365/230.03 |
| 6,760,273 B2 | * | 7/2004 | Nakazato | 365/230.05 |
| 6,885,596 B2 | * | 4/2005 | Asano et al. | 365/200 |

(Continued)

FOREIGN PATENT DOCUMENTS

JP 410069773 A * 3/1998

(Continued)

*Primary Examiner*—Viet Q Nguyen
(74) *Attorney, Agent, or Firm*—Volentine & Whitt, PLLC

(57) ABSTRACT

Disclosed herein are a semiconductor memory device and word line addressing method. The semiconductor memory device comprises a memory array comprising a plurality of word lines arranged in a predetermined sequence, and a word line driver adapted to sequentially address the plurality of word lines in a discontinuous manner relative to neighboring word lines. The method comprises addressing a plurality of word lines in a discontinuous manner relative to the predetermined sequence, such that neighboring word lines in the plurality of word lines are not coincidently addressed.

17 Claims, 9 Drawing Sheets

U.S. PATENT DOCUMENTS

| | | | |
|---|---|---|---|
| 6,917,560 B2 * | 7/2005 | Nii | 365/230.05 |
| 7,110,318 B2 * | 9/2006 | Nii | 365/230.05 |
| 7,110,319 B2 * | 9/2006 | Kim et al. | 365/230.06 |
| 7,244,995 B2 * | 7/2007 | Madan | 257/380 |
| 7,289,346 B2 * | 10/2007 | Sekiguchi et al. | 365/63 |
| 2007/0133288 A1 * | 6/2007 | Iwai et al. | 365/185.17 |

FOREIGN PATENT DOCUMENTS

| | | | |
|---|---|---|---|
| JP | 10241365 | * | 9/1998 |
| JP | 02001167572 A | * | 6/2001 |
| JP | 02004253135 A | * | 9/2004 |
| KR | 1020000071493 | | 11/2000 |
| KR | 1020030026534 | | 4/2003 |
| KR | 1020040094281 | | 11/2004 |

* cited by examiner

SEMICONDUCTOR MEMORY DEVICE AND WORD LINE ADDRESSING METHOD IN WHICH NEIGHBORING WORD LINES ARE DISCONTINUOUSLY ADDRESSED

BACKGROUND OF THE INVENTION

1. Field of the Invention

Embodiments of the invention relate generally to a semiconductor memory devices. More particularly, embodiments of the invention relate to a semiconductor memory device adapted for use with a word line addressing method capable of reducing coupling noise between neighboring word lines during a continuous read operation.

This application claims priority to Korean Patent Application No. 10-2006-52 filed Jan. 2, 2006, the subject matter of which is hereby incorporated by reference.

2. Description of the Related Art

In semiconductor memory devices such as synchronous flash memory, continuous read operations are commonly performed. A "continuous read operation" allows a plurality of word lines to be continuously and sequentially selected in a synchronous manner using one or more reference clock signals to read data. During a continuous read operation, one word line in the plurality of word lines, as selected during one clock cycle, is deactivated at about the same time as a next word line is activated during a next clock cycle.

FIG. 1 is a partial circuit diagram illustrating a conventional word line addressing method. The diagram illustrates part of a memory array 10 for a NOR-type nonvolatile semiconductor memory device. Referring to FIG. 1, a plurality of memory cells (MCs) are arranged in a matrix at the intersections of word lines 11 to 18 and bit lines BL<1:512>. As is customary, word lines 11 to 18 are arranged parallel.

In the conventional semiconductor memory device of FIG. 1, word lines 11 to 18 are sequentially addressed (i.e., selected) in an "upward" manner, (e.g., a sequence of WL<1>, WL<2>, WL<3>, WL<4>, etc.). Within the context of this addressing scheme, which is often used in conventional continuous read operations, coupling noise is generated on neighboring (e.g., physically adjacent of closely proximate) word lines as word lines 11 to 18 are continuously selected by the addressing sequence.

Referring to FIG. 2, during a first selection interval P1, a first word line 11, (WL<1>) having a first address is selected and activated at time t1. This event is immediately following by a second selection interval P2 in which a second word line 12, (WL<2>) having a second address is selected and activated. During the second selection interval P2, previously activated first word line 11 (WL<1>) is deactivated at time t2. Simultaneously (or nearly simultaneously), second word line 12 (WL<2>) is activated at time t3. This coincidental deactivation/activation of neighboring word lines causes noise to be coupled onto the word line being activated. See, for example, portion A of FIG. 2. This noise is generated, for example, as first word line 11 (WL<1>) is switched from a read voltage (VREAD) signal to a ground voltage (VSS), and the second word line 12 (WL<2>) is switched from the ground voltage (VSS) to the read voltage (VREAD). The coupling noise thus generated may actually delay the activated of second word line 12 (WL<2>) in particularly bad instances.

Thus, the continuous read operation, as executed in conventional semiconductor memory devices, may be characterized by the problem delayed word line activation due to noise coupled from neighboring word lines. This problem becomes more serious as the physical separation between neighboring word line decreases due to increased device density and as activation intervals decrease as operating frequency increases.

SUMMARY OF THE INVENTION

Accordingly, embodiments of the invention address this problem and generally provide a semiconductor memory device and related word line addressing method allowing reduced coupling noise between neighboring word lines during a continuous read operation.

In one embodiment of the invention, a semiconductor memory device is provided and comprises a memory array comprising a plurality of word lines arranged in a predetermined sequence, and a word line driver adapted to sequentially address the plurality of word lines in a discontinuous manner relative to neighboring word lines.

In another embodiment of the invention, a word line addressing method is provided and comprises addressing the plurality of word lines in a discontinuously manner relative to the predetermined sequence, such that neighboring word lines in the plurality of word lines are not coincidently addressed.

DESCRIPTION OF EXEMPLARY EMBODIMENTS

Figure 1:
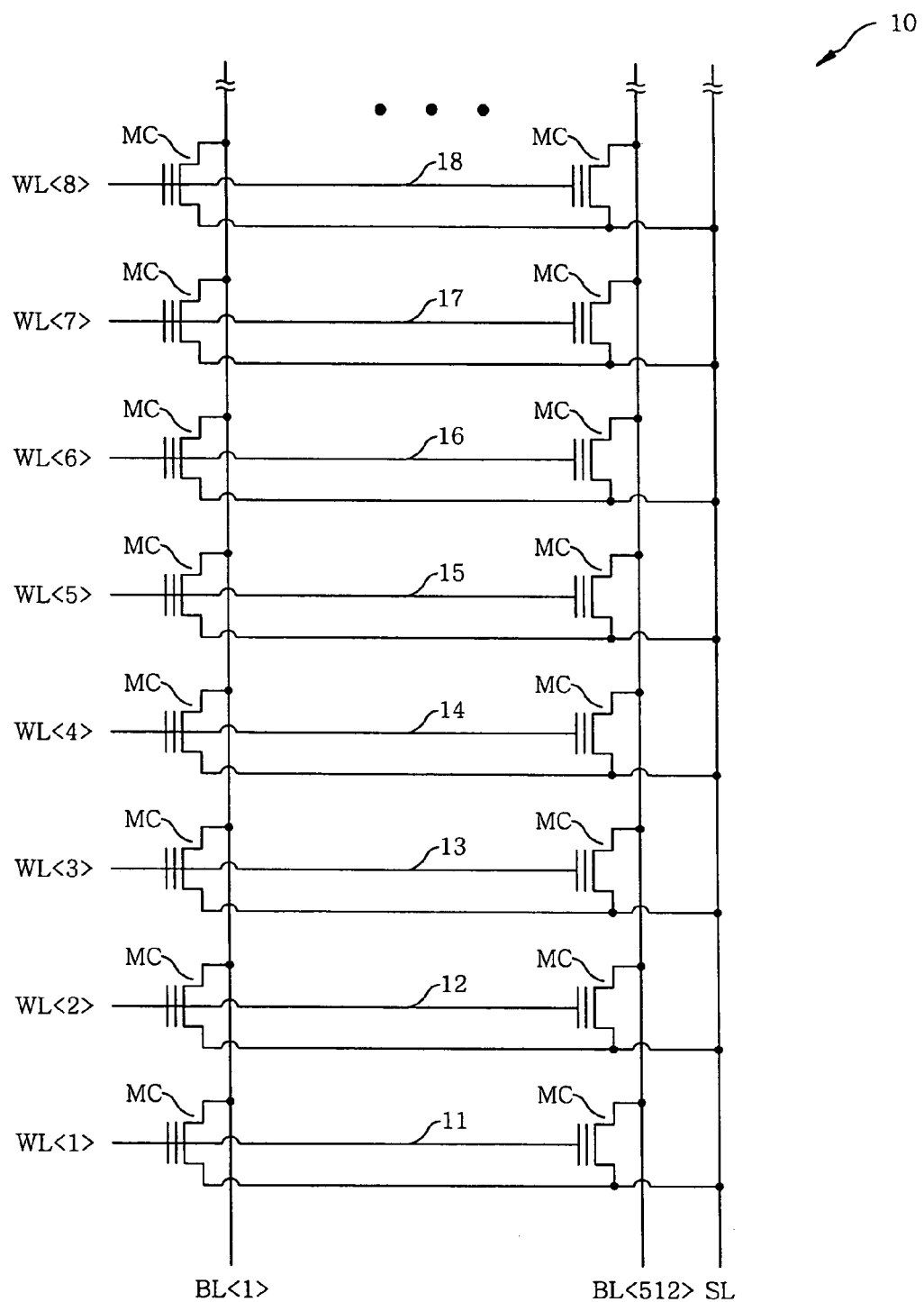
FIG. 1 is a diagram illustrating a conventional word line addressing method for a conventional semiconductor memory device.
Figure 2:
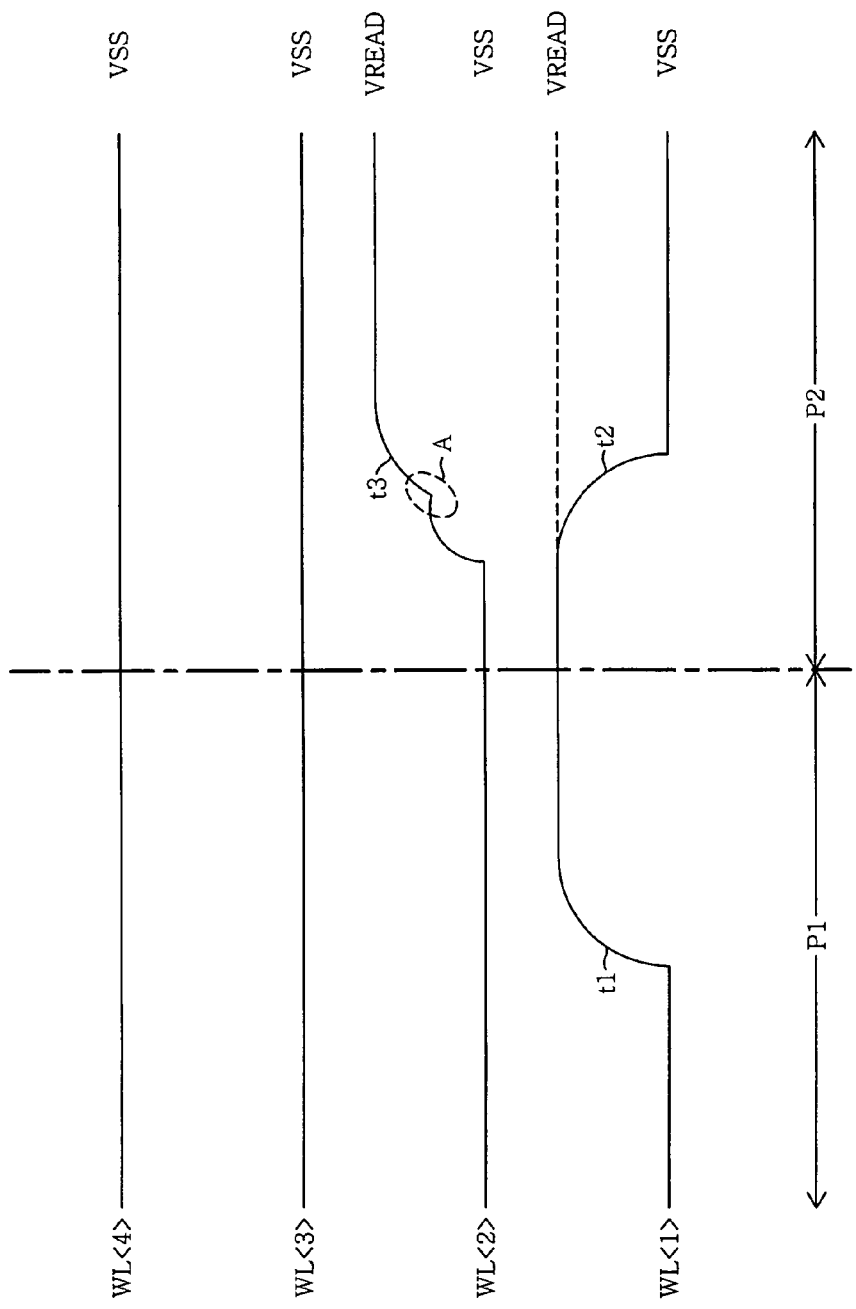
FIG. 2 is a diagram illustrating coupling noise that is generated between neighboring word lines during a continuous read operation in the conventional semiconductor memory device.

Several embodiments of the invention will now be described with reference to the accompanying drawings in which similar reference numerals indicate similar components.

Figure 3:
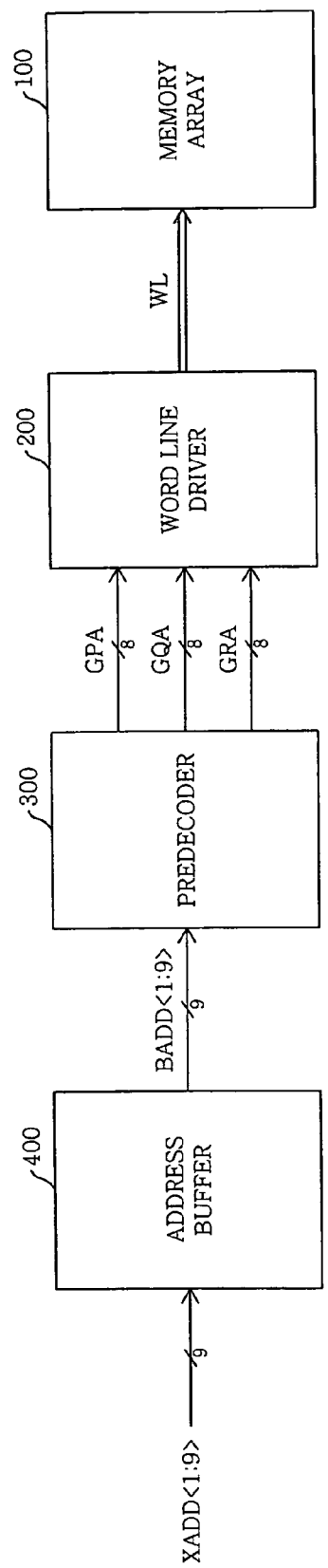
FIG. 3 is a diagram illustrating a word line addressing path in a semiconductor memory device according to an embodiment of the present invention.

FIG. 3 is a block diagram illustrating a word line addressing path for an exemplary semiconductor memory device according to one embodiment of the invention. Referring to FIG. 3, the semiconductor memory device comprises a memory array 100 and a word line driver 200. Memory array 100 comprises a conventional matrix of memory cells arranged across intersecting word and bit lines. Consistent with the former example, the illustrated embodiment is assumed to comprise eight (8) words line and five hundred and twelve (512) bits lines, but this choice of word and bit line numbers is merely exemplary.

Figure 4:
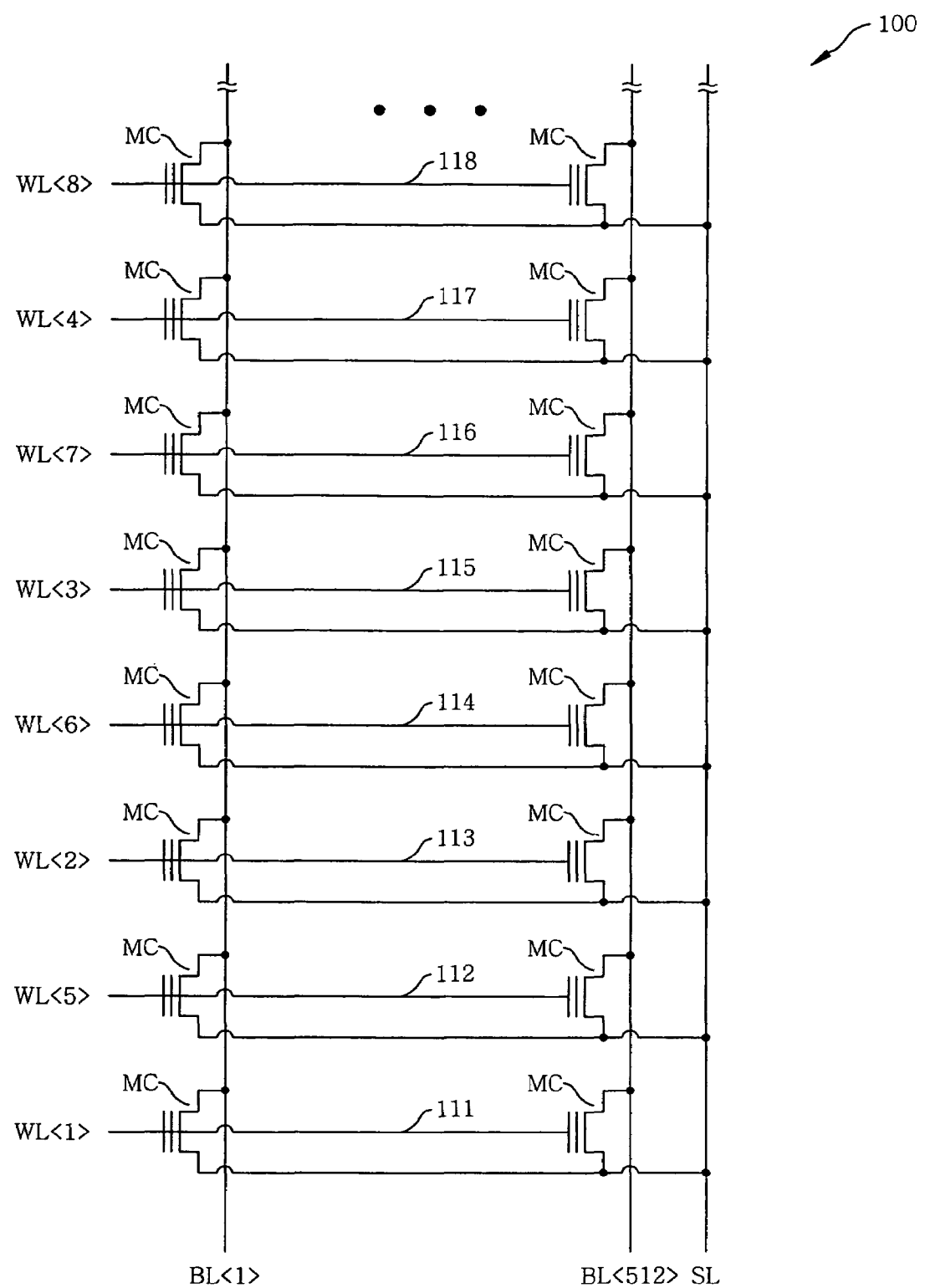
FIG. 4 is a diagram illustrating word line addressing in a semiconductor memory device according to an embodiment of the present invention.

For example, FIG. 4 is a partial circuit diagram further illustrating the word line addressing scheme according to an embodiment of the present invention. As before the circuit diagram assumes a NOR-type nonvolatile semiconductor memory device, but this is just one example of many specific memory types susceptible to the advantages of the present invention. In FIG. 4, the reference character 'SL' designates a source line maintained at a ground voltage (VSS) and adapted for use during a continuous read operation. The memory cells illustrated in FIG. 4 are thus nonvolatile, NOR-type memory cells selected by the respective word lines during a read operation. A selected word line is activated by applying a read voltage (VREAD) while unselected word lines are maintained at ground voltage (VSS).

Referring to FIG. 4, memory array 100 comprises a plurality of word lines 111 to 118 and a plurality of bit lines BL<1:512>. A plurality of memory cells MCs is arranged at the intersections of the word lines 111 to 118 and the bit lines BL<1:512>.

Word lines 111 to 118 are arranged in an upward sequence, and may be addressed in a sequence of WL<1>, WL<2>, WL<3>, WL<4>, WL<5>, WL<6>, WL<7> and WL<8>. In more detail, a first word line 111 is located closest to the illustrated "bottom" of the circuit diagram and is addressed by a first address WL<1>. A third word line 113 is located third from the bottom but is addressed by a second address WL<2>. A second word line 112 is located between first word line 111 and third word line 113, but is addressed by a fifth address WL<5>, etc.

That is, neighboring word lines are addressed in a discontinuous manner, by a sequence of address values. In other words, in a semiconductor memory device consistent with an embodiment of the invention, a plurality of word lines to be continuously addressed are not physically arranged at neighboring locations relative to the addressing sequence.

By this arrangement, the plurality of word lines continuously addressed during a continuous read operation will not suffer from the effects of noise coupled from neighboring word line deactivations. This result is further described with reference to FIG. 5.

Figure 5:
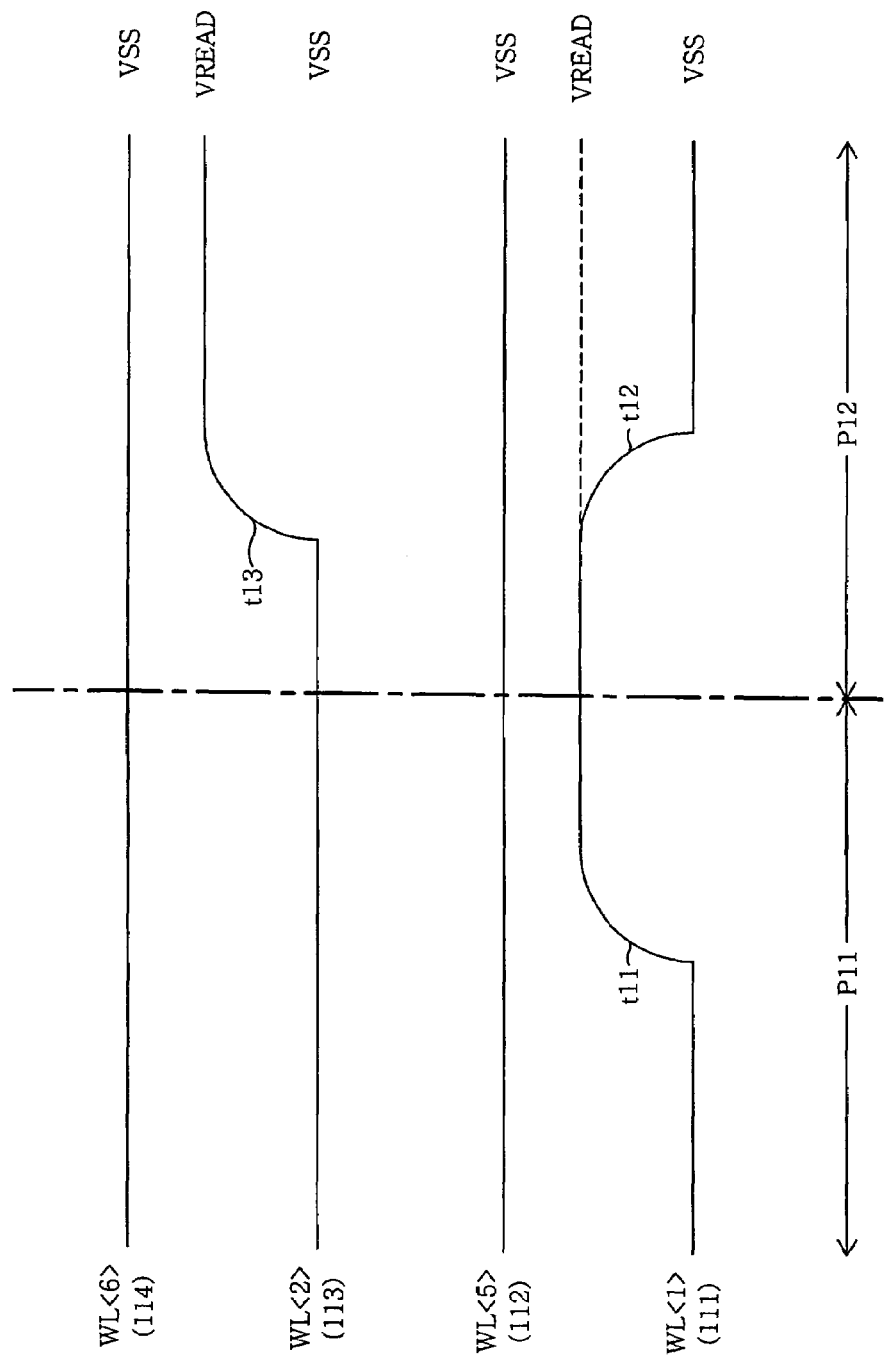
FIG. 5 is a diagram illustrating an operation of continuously selecting word lines in the semiconductor memory device of the present invention.

FIG. 5 is a selected word line voltage diagram illustrating an exemplary operation characterized by continuous selection of word lines in a semiconductor memory device according to an embodiment of the invention. Referring to FIG. 5, immediately after a first selection interval P11, a second selection interval P12 begins.

During the first selection interval P11, first word line 111 (addressed as WL<1>), is activated by application of a read voltage (VREAD) at time t11. During the second selection interval P12, first word line 111 (addressed as WL<1>) is deactivated by switching it to ground voltage (VSS) at time t12. Coincident (or approximately coincident) with time t12, third word line 113 (addressed as WL<2>) is activated by application of read voltage (VREAD) at time t13. However, during these time periods (e.g., t12 and t13), a predetermined fixed voltage is applied to second word line 112 (addressed as WL<5>) which is physically located between first word line 111 and third word line 113. Accordingly, second word line 112 (addressed as WL<5>) functions as a shielding line during the coincident deactivation first word line 111 (addressed as WL<1>) and activation of third word line 113 (addressed as WL<3>). In one embodiment, the fixed voltage applied to second word line 112 (addressed as WL<5>) during t12 and t13 is ground voltage (VSS). Due to the advantages offered by the foregoing approach, a continuous read operation may be applied to a semiconductor memory device in which a plurality of word lines is continuously and sequentially selected without the delay associated with coupling noise generated between neighboring word lines.

Referring to FIG. 3 again, word line driver 200 addresses the plurality of word lines (WLs) in accordance with a combination of pre-decoding addresses PA<1:8>, QA<1:8> and RA<1:8> that are respectively selected from first, second and third pre-decoding address groups GPA, GQA and GRA.

In the illustrated embodiment, the pre-decoding address PA<1:8> included in the first pre-decoding address group GPA may be referred to as a "block selection pre-decoding address", the pre-decoding address QA<1:8> included in the second pre-decoding address group GQA may be referred to as a "set selection pre-decoding address", and the pre-decoding address RA<1:8> included in the third pre-decoding address group GRA may be referred to as a "buffer selection pre-decoding address".

Figure 6A:
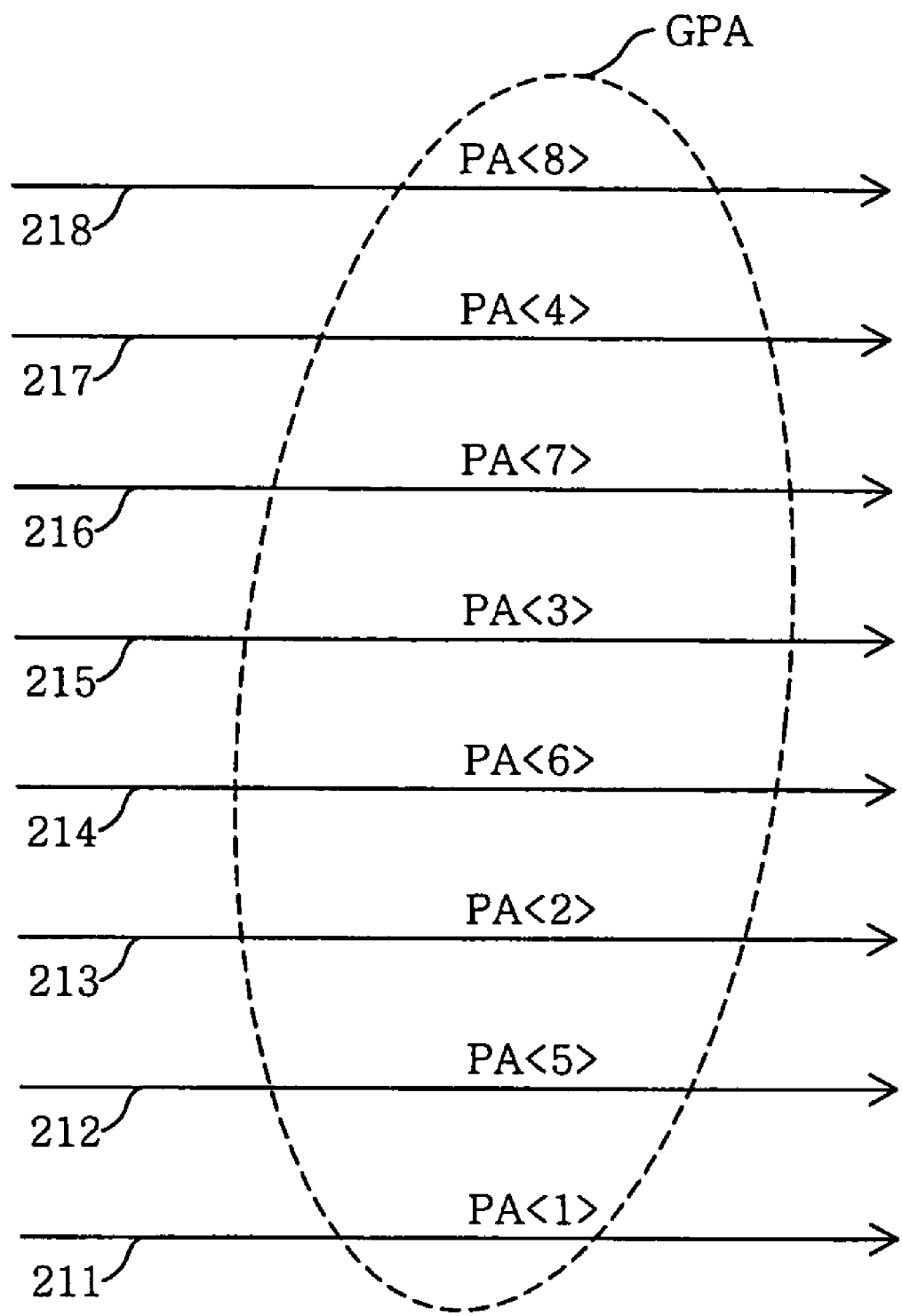
FIGS. 6A to 6C are diagrams illustrating the addressing and wiring of GPA, GQA and GRA of FIG. 3.

The first pre-decoding address group GPA includes a plurality of block selection pre-decoding addresses PA<1:8>. With reference to FIG. 6A, a plurality of signal lines 211 to 218 adapted to transmit the plurality of block selection pre-decoding addresses PA<1:8> is arranged in parallel according to a predetermined sequence. In a manner like the illustrated example, two neighboring signal lines may be used to transmit discontinuous block selection pre-decoding addresses PA<1:8>.

For example, two continuous block selection pre-decoding addresses PA<1> and PA<2> may be transmitted through non-neighboring signal lines 211 and 213, where signal line 212 may act as a shielding line. Thus, in a case where block selection pre-decoding addresses to be transmitted through neighboring signal lines are discontinuously addressed, coupling noise generated between the signal lines may be reduced during a continuous read operation.

Figure 6B:
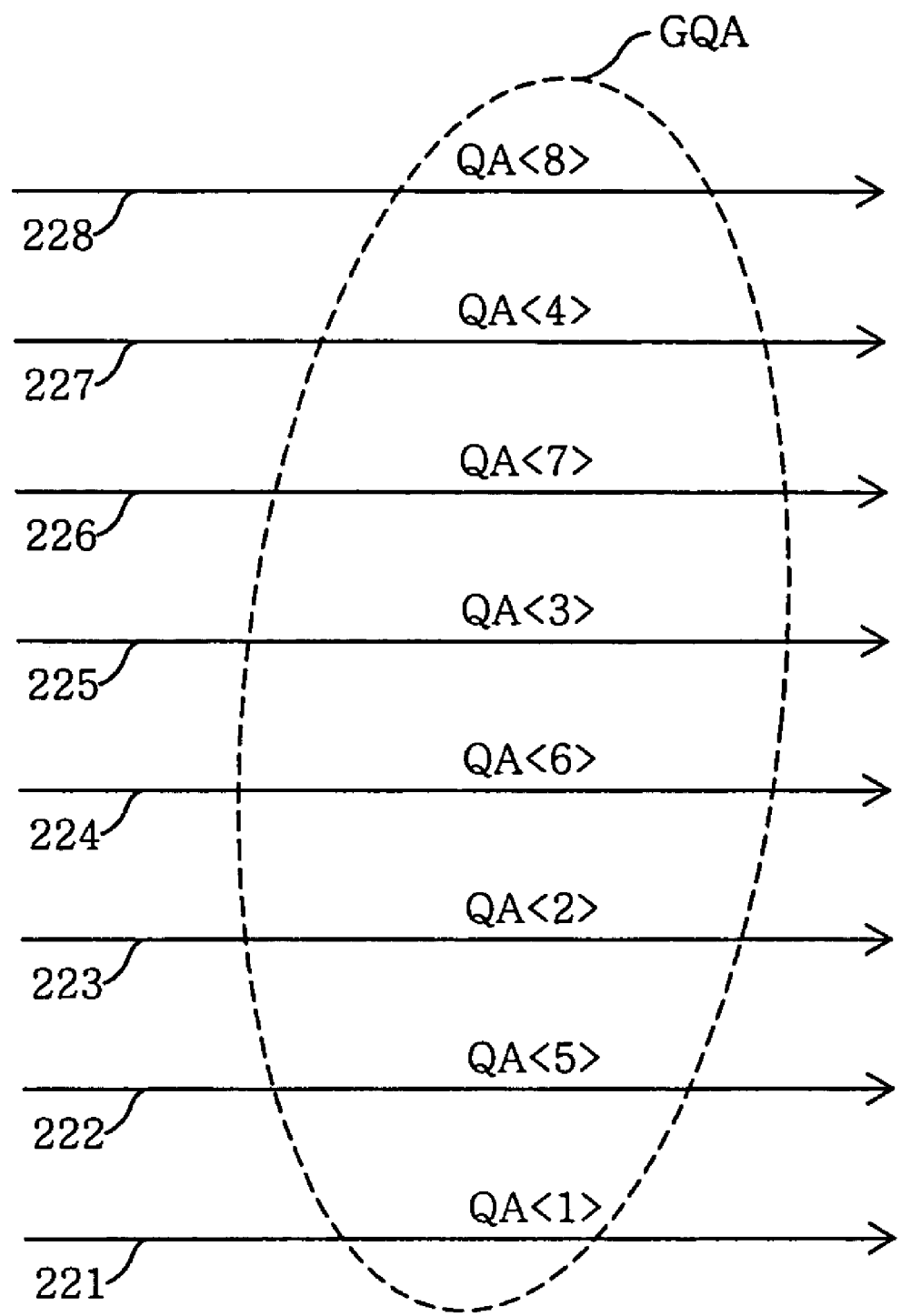

The second pre-decoding address group GQA includes a plurality of set selection pre-decoding addresses QA<1:8>. With reference to FIG. 6B, a plurality of signal lines 221 to 228 adapted to transmit the plurality of set selection pre-decoding addresses QA<1:8> is arranged in parallel according to a predetermined sequence. With this arrangement, two neighboring signal lines may be used to transmit discontinuous block selection pre-decoding addresses QA<1:8>. Thus, in a case where set selection pre-decoding addresses to be transmitted through neighboring signal lines are discontinuously addressed, coupling noise generated between the signal lines may be reduced during a continuous read operation.

Figure 6C:
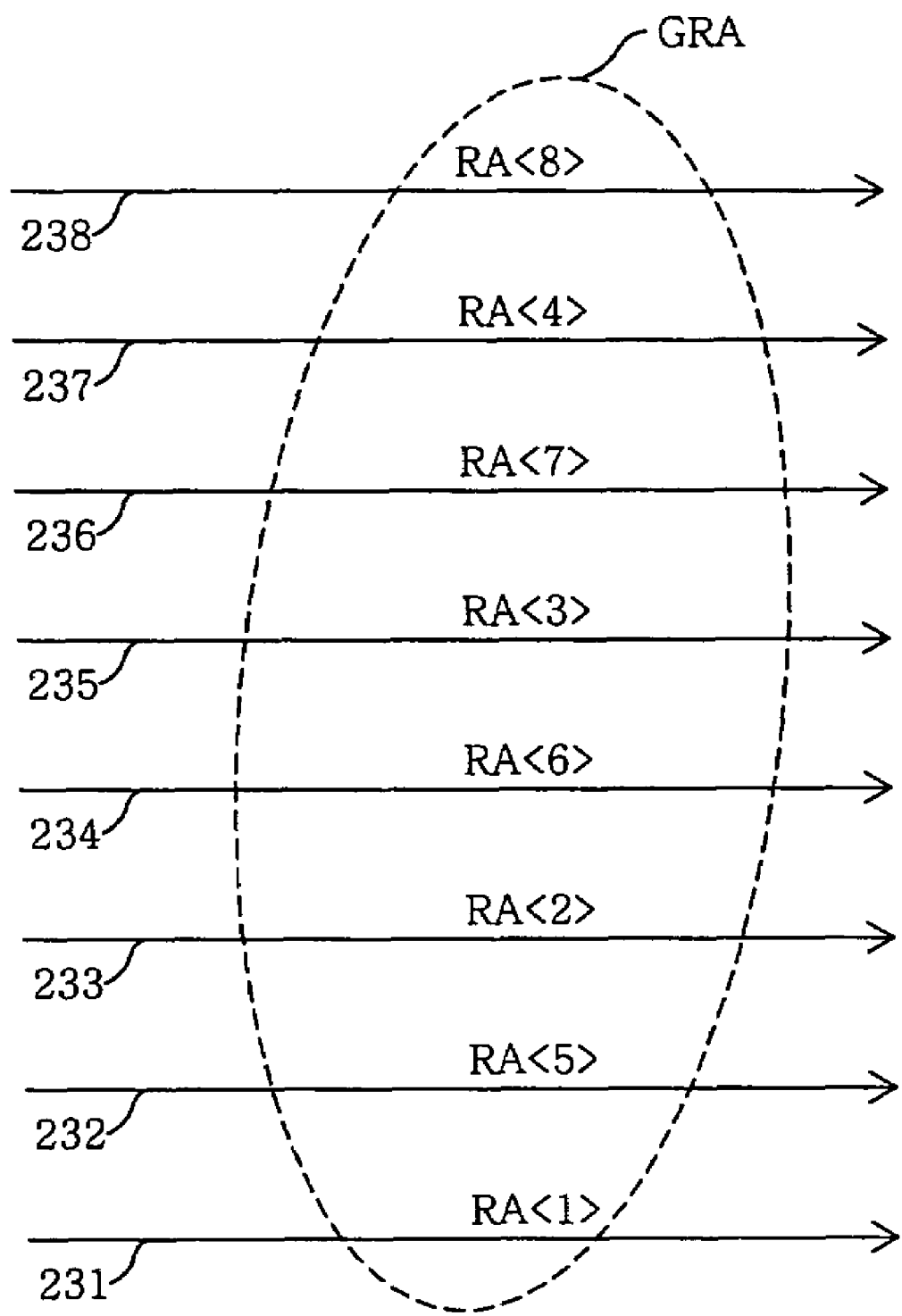

The third pre-decoding address group GRA includes a plurality of buffer selection pre-decoding addresses RA<1:8>. With reference to FIG. 6C, a plurality of signal lines 231 to 238 adapted to transmit the plurality of set selection pre-decoding addresses RA<1:8> is arranged parallel according to a predetermined sequence. With this arrangement, two neighboring signal lines may be used to transmit discontinuous buffer selection pre-decoding addresses RA<1:8>. Thus, in a case where buffer selection pre-decoding addresses to be transmitted through neighboring signal lines are discontinuously addressed, coupling noise generated between the signal lines can be reduced during the continuous read operation.

Referring to FIG. 3 again, the exemplary semiconductor memory device may further comprise a pre-decoder 300 adapted to generate the first, second and third pre-decoding address groups GPA, GQA and GRA.

Figure 7:
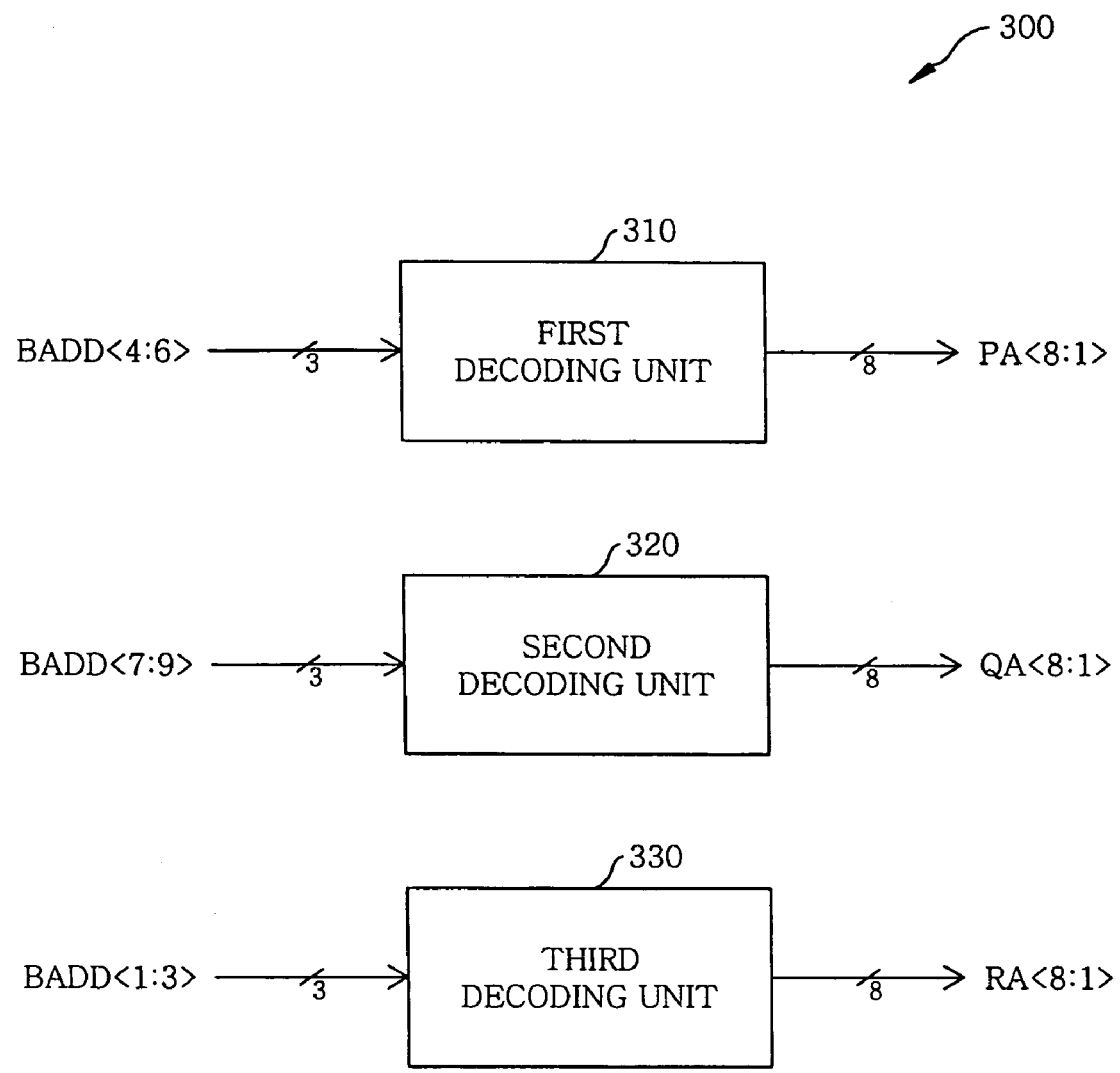
FIG. 7 is a diagram illustrating the predecoder of FIG. 3 in detail.

FIG. 7 is a block diagram illustrating an exemplary pre-decoder 300 in some additional detail. Referring to FIG. 7, pre-decoder 300 comprises first, second and third decoding units 310, 320 and 330.

First decoding unit 310 is adapted to generate the block selection pre-decoding address PA<1:8> by decoding a first buffering address group BADD<4:6>. Second decoding unit 320 is adapted to generate the set selection pre-decoding address QA<1:8> by decoding a second buffering address group BADD<7:9>. Furthermore, third decoding unit 330 is adapted to generate the buffer selection pre-decoding address RA<1:8> by decoding a third buffering address group BADD<1:3>.

In the illustrated embodiment, signal lines for transmitting the first buffering address group BADD<4:6> and the third buffering address group BADD<1:3> to be continuously addressed are not arranged at neighboring locations. As a result, during a continuous read operation, coupling noise generated between the signal lines can be reduced.

Referring to FIG. 3 again, the exemplary semiconductor memory device may further comprise an address buffer 400. Address buffer 400 is adapted to generate first, second and third buffering address groups BADD<4:6>, BADD<7:9> and BADD<1:3> by buffering external addresses XADD<1:9>. In this example, it is preferred that signal lines adapted to transmit external addresses XADD<1:9> not be arranged in manner such that continuously addressing occurs coincidentally between neighboring signal lines. Thus, during a continuous read operation in which word lines are continuously and sequentially read, coupling noise generated between signal lines adapted to transmit external address groups may be reduced.

In semiconductor memory devices according to embodiments of the invention, neighboring word lines are discontinuously addressed. Additionally, such semiconductor memory devices reduce coupling noise during a continuous read operation applied to word lines sequentially read.

Although the invention has been described in the context of several embodiments, those of ordinary skill in the art will appreciate that various modifications, additions and substitutions are possible, without departing from the scope of the invention as defined by the following claims.

What is claimed is:

1. A semiconductor memory device, comprising:
   a memory array comprising a plurality of word lines arranged in a non-hierarchical and predetermined sequence; and
   a word line driver sequentially addressing the plurality of word lines during a continuous read operation in a discontinuous manner such that no two neighboring word lines are sequentially activated.

2. The semiconductor memory of claim 1, wherein the word line driver maintains one word line of the plurality of word lines at a predetermined fixed voltage during sequential addressing of two words lines neighboring the one word line.

3. The semiconductor memory device of claim 2, wherein the predetermined fixed voltage is a ground voltage.

4. The semiconductor memory device of claim 2, wherein the memory array comprises nonvolatile memory cells.

5. The semiconductor memory device of claim 1, further comprising a pre-decoder adapted to generate first, second and third pre-decoding address groups;
   wherein the word line driver is further adapted to address the plurality of word lines in accordance with a combination of pre-decoding addresses respectively selected from the first, second and third pre-decoding address groups.

6. The semiconductor memory device of claim 5, wherein:
   the first pre-decoding address group comprises a plurality of block selection pre-decoding addresses transmitted to the word line driver through a plurality of signal lines arranged in a predetermined sequence; and
   any two block selection pre-decoding addresses are transmitted via the plurality of signal lines in a discontinuous manner relative to predetermined arrangement sequence.

7. The semiconductor memory device of claim 5, wherein:
   the second pre-decoding address group comprises a plurality of set selection pre decoding addresses transmitted to the word line driver through a plurality of signal lines arranged in a predetermined sequence; and
   any two set selection pre-decoding addresses are transmitted via the plurality of signal lines in a discontinuous manner relative to predetermined arrangement sequence.

8. The semiconductor memory device of claim 5, wherein:
   the third pre-decoding address group comprises a plurality of buffer selection pre-decoding addresses transmitted to the word line driver through a plurality of signal lines arranged in a predetermined sequence;
   wherein any two buffer selection pre-decoding addresses are transmitted via the plurality of signal lines in a discontinuous manner relative to predetermined arrangement sequence.

9. A word line addressing method adapted for use in a semiconductor memory device comprising a plurality of word lines arranged in a non-hierarchical and predetermined sequence, the method comprising:
   addressing the plurality of word lines during a continuous read operation in a discontinuously manner relative to the predetermined sequence, such that no two neighboring word lines in the plurality of word lines are sequentially activated.

10. The word line address method of claim 9, further comprising:
    addressing first, second and third pre-decoding address group arranged in a predetermined sequence;
    wherein the plurality of word lines are addressed according to a combination of pre-decoding addresses selected respectively from the first, second and third pre-decoding address groups.

11. The word line addressing method of claim 10, wherein:
    the first pre-decoding address group comprises a plurality of block selection pre-decoding addresses to be transmitted through respective signal lines arranged in a predetermined sequence; and
    two block selection pre-decoding addresses to be transmitted through neighboring signal lines are discontinuous.

12. The word line addressing method of claim 10, wherein:
    the second pre-decoding address group comprises a plurality of set selection pre-decoding addresses to be transmitted through respective signal lines arranged in a predetermined sequence; and
    two set selection pre-decoding addresses to be transmitted through neighboring signal lines are discontinuous.

13. The word line addressing method of claim 10, wherein:
    the third pre-decoding address group comprises a plurality of buffer selection pre-decoding addresses to be transmitted through respective signal lines arranged in a predetermined sequence; and
    two buffer selection pre-decoding addresses to be transmitted through neighboring signal lines are discontinuous.

14. A word line addressing method adapted for use in a semiconductor memory device comprising a plurality of word lines arranged in a predetermined sequence, the method comprising:
    addressing first, second and third pre-decoding address groups arranged in a predetermined sequence, wherein the plurality of word lines are addressed according to a combination of pre-decoding addresses selected respectively from the first, second and third pre-decoding address groups; and addressing the plurality of word lines in a discontinuous manner relative to the predetermined sequence, such that neighboring word lines in the plurality of word lines are not coincidently addressed, wherein the first pre-decoding address group comprises a plurality of block selection pre-decoding addresses transmitted through respective signal lines arranged in a predetermined sequence, and any two block selection pre-decoding addresses transmitted through neighboring signal lines are discontinuous.

15. The word line addressing method of claim 14, wherein:

the second pre-decoding address group comprises a plurality of set selection pre-decoding addresses transmitted through respective signal lines arranged in a predetermined sequence, and any two set selection pre-decoding addresses transmitted through neighboring signal lines are discontinuous.

16. The word line addressing method of claim 14, wherein:

the third pre-decoding address group comprises a plurality of buffer selection pre-decoding addresses transmitted through respective signal lines arranged in a predetermined sequence, and any two buffer selection pre-decoding addresses transmitted through neighboring signal lines are discontinuous.

17. A non-volatile semiconductor memory device adapted to perform a continuous read operation, and comprising:

a memory array comprising a plurality of NOR-type memory cells connected at the respective intersections of a plurality of bits lines and a plurality of word lines; and a word line driver sequentially addressing the plurality of word lines during a continuous read operation in a discontinuous manner relative to neighboring word lines.

* * * * *